United States Patent
Bedell et al.

(10) Patent No.: US 8,865,530 B2
(45) Date of Patent: Oct. 21, 2014

(54) EXTREMELY THIN SEMICONDUCTOR ON INSULATOR (ETSOI) LOGIC AND MEMORY HYBRID CHIP

(71) Applicant: International Business Machines Corporation, Armonk, NY (US)

(72) Inventors: Stephen W. Bedell, Wappingers Falls, NY (US); Bahman Hekmatshoar-Tabari, White Plains, NY (US); Ali Khakifirooz, Mountain View, CA (US); Ghavam G. Shahidi, Round Ridge, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/791,554

(22) Filed: Mar. 8, 2013

(65) Prior Publication Data

US 2014/0252446 A1  Sep. 11, 2014

(51) Int. Cl.
*H01L 21/00* (2006.01)
*H01L 21/336* (2006.01)
*H01L 21/30* (2006.01)
*H01L 29/788* (2006.01)
*H01L 29/66* (2006.01)

(52) U.S. Cl.
CPC ........ *H01L 29/66825* (2013.01); *H01L 29/788* (2013.01)
USPC ........... 438/149; 438/197; 438/455; 438/458; 257/262; 257/368

(58) Field of Classification Search
USPC .......... 438/149, 197, 279, 455, 458; 257/262, 257/368, 369
See application file for complete search history.

(56) References Cited

U.S. PATENT DOCUMENTS

| | | | |
|---|---|---|---|
| 7,495,279 B2 | 2/2009 | Shum et al. | |
| 8,247,261 B2 | 8/2012 | Bedell et al. | |
| 2004/0262635 A1* | 12/2004 | Lee | 257/199 |
| 2010/0052034 A1 | 3/2010 | Cheng et al. | |
| 2010/0307572 A1 | 12/2010 | Bedell et al. | |
| 2010/0311250 A1 | 12/2010 | Bedell et al. | |

OTHER PUBLICATIONS

Liu, Q., et al., "Ultra-Thin-Body and Box (UTBB) Fully Depleted (FD) Device Integration for 22nm Node and Beyond", 2010 Symposium on VLSI Technology Digest of Technical Papers, Jun. 15-17, 2010.
U.S. Office Action dated Jan. 22, 2014 received in related U.S. Appl. No. 14/029,171.

* cited by examiner

*Primary Examiner* — Hsien Ming Lee
(74) *Attorney, Agent, or Firm* — Scully, Scott, Murphy & Presser, P.C.; Louis J. Percello, Esq.

(57) ABSTRACT

A method of forming a semiconductor device that includes providing a logic device on a semiconductor on insulating layer of a transfer substrate. The transfer substrate may further include a dielectric layer and a first handle substrate. A second handle substrate may be contacted to the semiconductor on insulating layer of the transfer substrate that includes logic device. The first handle substrate may be removed to expose the dielectric layer. A memory device can then be formed on the dielectric layer. Interconnect wiring can then be formed connecting the logic device with the memory device.

21 Claims, 8 Drawing Sheets

EXTREMELY THIN SEMICONDUCTOR ON INSULATOR (ETSOI) LOGIC AND MEMORY HYBRID CHIP

BACKGROUND

The present disclosure relates to semiconductor and memory structures and a method of forming the same. More particularly, the present disclosure relates to semiconductor and memory devices that are formed on thin semiconductor-on-insulator (ETSOI) substrates.

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Further, for many applications, the weight of the electrical components is desired to be significantly reduced. It is commonly known that the weight of the handle substrate in silicon on insulator (SOI) substrates is the main contributor in the total weight of the electronic system.

SUMMARY

In one aspect of the present disclosure, a method of forming logic circuitry in combination with a memory device on an extremely thin semiconductor on insulator (ETSOI) substrate is provided. In one embodiment, the method may include providing a logic device on a semiconductor on insulating layer of a transfer substrate. The transfer substrate may further include a dielectric layer and a first handle substrate. A second handle substrate may be contacted to the semiconductor on insulating layer of the transfer substrate that includes logic device. The first handle substrate may be removed to expose the dielectric layer. A memory device can then be formed on the dielectric layer. Interconnect wiring can then be formed connecting the logic device with the memory device.

In another embodiment, a method of forming a semiconductor structure is provided that may include forming a logic device on a semiconductor on insulating (SOI) layer of a transfer substrate. The transfer substrate may include a first dielectric layer that is in contact with the SOI layer, a floating gate layer that is in contact with the first dielectric layer, a second dielectric layer that is in contact with the floating gate layer, and a first handle substrate that is in contact with the second dielectric layer. A second handle substrate may be contacted to the SOI layer of the transfer substrate that includes the logic device. The first handle substrate may be removed to expose the second dielectric layer. A memory device may be formed on the second dielectric layer. Interconnect wiring may be formed connecting the logic device with the memory device.

In yet another aspect of the present disclosure, a semiconductor device is provided that includes a substrate composed of at least a dielectric layer and an active semiconductor layer. A memory device is positioned on a first side of the dielectric layer and is comprised of a floating gate layer, a control oxide layer, and a control gate layer. A logic device is present on a second side of the dielectric layer and is comprised of a gate structure, a source region and a drain region. The source region and the drain region are present in the active semiconductor layer.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "vertical", "horizontal", "top", "bottom", and derivatives thereof shall relate to the disclosed structures and methods, as oriented in the drawing figures.

In complementary metal oxide semiconductor (CMOS) scaling, the weight of the handle substrate in silicon on insulator (SOI) substrates is the main contributor to the total weight of the electronic system. In some applications, it can be desirable to fully remove the handle substrate after processing is complete. In some embodiments, the present disclosure provides methods of removing a handle substrate in a process sequence that forms a logic device on the semiconductor on insulator (SOI) layer of an SOI substrate, and forms a memory device on the side of the buried dielectric layer of the SOI substrate opposite the SOI layer, wherein the memory device and the logic device are connected by an electrically conductive pathway that extends through the buried dielectric layer. In some embodiments, the process sequence that is disclosed herein may include controlled spalling in combination with SOI substrates having an extremely thin semiconductor on insulator (ETSOI) layer to provide logic devices and memory devices on the same substrate.

Figure 1:
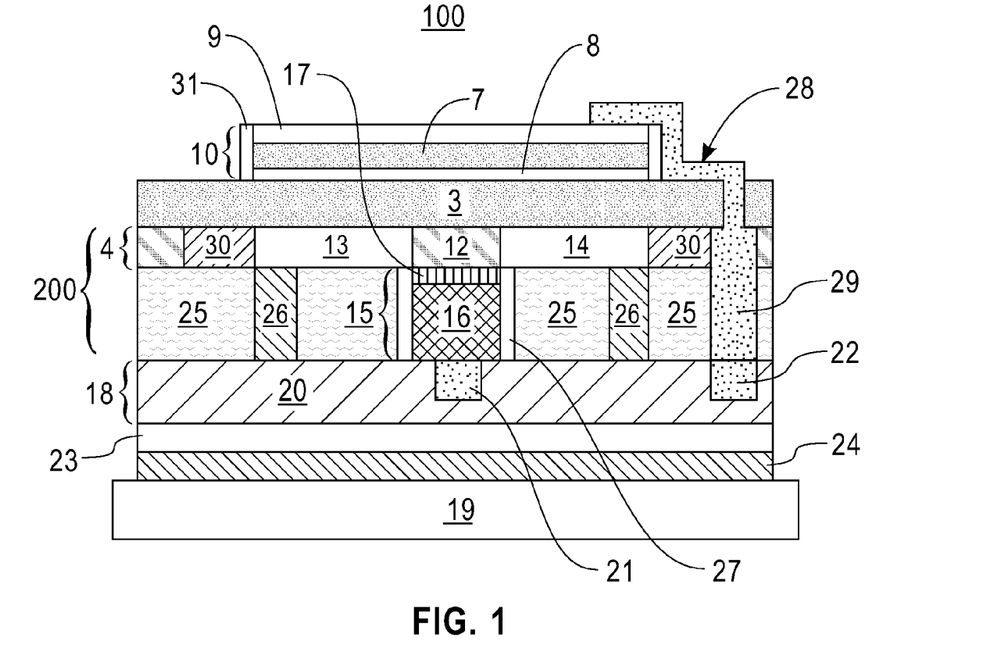
FIG. 1 is a side cross-sectional view of one embodiment of an electrical structure that includes a memory device and a semiconductor device, in accordance with one embodiment of the present disclosure.

FIG. 1 depicts one embodiment of an electrical device including a memory device 100 and a logic device 200 that are formed on the same semiconductor substrate. In this embodiment, by being formed on the same semiconductor substrate it is meant that at least a portion of the gate structure 10 of the memory device 100 is formed on the buried dielectric layer 3 of an SOI substrate, and the gate structure 15 of the logic device 200 is formed on the SOI layer 4 of the SOI substrate, wherein both the buried dielectric layer 3 and the SOI layer 4 are provided by the same SOI substrate. In some embodiments, the SOI layer 4 is composed of a semiconductor material, such as a silicon-containing material. Examples of silicon containing materials include silicon, single crystal silicon, silicon germanium, and combinations thereof. The SOI layer 4 typically has a thickness of less than 10 nm. In some embodiments, the SOI layer 4 has a thickness ranging from 2 nm to 8 nm. In some other embodiments, the SOI layer 4 has a thickness that ranges from 2 nm to 20 nm. The SOI layer 4 also includes shallow trench isolation (STI) region 30 disposed therein.

The term "memory device" denotes a structure in which the electrical state thereof can be altered and then retained in the altered state, in this way a bit of information can be stored. In the example that is depicted in FIG. 1, the memory device 100 that is formed on the buried dielectric layer 3 is a flash memory device. In a flash memory device, a memory cell is provided that is similar to a typical field effect transistor, except the gate structure 10 includes two gate conductors 9, 8 instead of one, in which the two gate conductors 9, 8 are separated by a control dielectric layer 7. The lower gate conductor 8 is hereafter referred to as a floating gate layer. The floating gate layer 8 is surrounded, i.e., insulated, by dielectric material, wherein because the floating gate layer 8 is insulated by dielectrics, any electrons placed on it can be trapped there. In the embodiment that is depicted in FIG. 1, the floating gate layer 8 is surrounded and insulated by the buried dielectric layer 3, the control dielectric layer 7 and a spacer 11 that is formed on the sidewalls of the gate structure 10 to the memory device 100.

The electrons can be trapped on the floating gate layer 8 for time periods of on the order of years, or less. The upper gate conductor 9 is hereafter referred to as the control gate layer. When the floating gate layer 8 holds a charge, it screens (partially cancels) the electric field from the control gate layer 9, which modifies the threshold voltage (VT) of the cell, e.g., more voltage has to be applied to the control gate layer 9 to make the channel conduct. For read-out, a voltage intermediate between the possible threshold voltages is applied to the control gate layer 9, and the semiconductor channel's conductivity is tested (the portion of semiconductor underlying the floating gate layer 8), which is influenced by the floating gate layer 8. Typically, the current flow through the semiconductor channel is sensed and forms a binary code, reproducing the stored data. The semiconductor channel of the memory device 100 is provided by the portion, i.e., channel portion 12, of the SOI layer 4 that also provides the semiconductor channel of the logic device 200. On opposing sides of the channel portion 12 of the SOI layer 4 are doped regions 13, 14, i.e., n-type or p-type doped region, that function as the source region and drain region of the logic device 200 and the memory device 100.

Still referring to FIG. 1, in addition to the channel portion 12 of the SOI layer 4 providing the semiconductor channel of the memory device 100, the channel portion 12 of the SOI layer 4 provides the semiconductor channel of the logic device 200 that is formed on the same semiconductor substrate as the memory device. In some examples, the logic device 200 is an electrical device that can produce a signal that can be associated with a "1" or a "0" value, as typically used in a binary code. The logic device can include a semiconductor device. As used herein, "semiconductor device" refers to an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor determine the conductivity type of the semiconductor, e.g., n-type or p-type conductivity.

In the embodiment depicted in FIG. 1, the logic device 200 is a field effect transistor (FET). A "field effect transistor" is a semiconductor device in which the output current, i.e., source-drain current, is controlled by the voltage applied to the gate structure. The gate structure 15 of the FET is the structure used to control output current (i.e., flow of carriers in the channel region) of a semiconducting device through electrical or magnetic fields. The gate structure 15 typically includes at least one gate conductor 16 and at least one gate dielectric 17. As used herein, the term "channel portion" is the region of semiconductor material that is underlying the gate structure 15, wherein the channel portion is between the source region, i.e., doped region 14, and the drain region, i.e., doped region 13, of the semiconductor device that becomes conductive when the semiconductor device is turned on. As used herein, the term "source" is a doped region in the semiconductor device, in which majority carriers are flowing into the channel region of the semiconductor device. The term "drain" means a doped region in semiconductor device located at the end of the channel, in which carriers are flowing out of the semiconductor device through the drain. In one embodiment, the source region, i.e., doped region 13, of the logic device 200, e.g., FET, may be shared with the source region, i.e., doped region 13, of the memory device 100. In one embodiment, the drain region, i.e., doped region 14, of the logic device 200, e.g., FET, may be shared with drain region, i.e., doped region 14, of the memory device 100.

The electrical device that is depicted in FIG. 1 also includes a read and write wiring layer 18 that is present between the SOI layer 4 and a handling substrate 19 (referred to in the later described method as a second handling substrate). In some embodiments, an interconnect layer 23 and a stressor layer 24 are present between the read and write wiring layer 18 and the handling substrate 19. The interconnect layer 23 may include various metal interconnects and wiring layers. In some examples, the various metal interconnects may include aluminum (Al), copper (Cu) and tungsten (W). In some embodiments, the SOI layer 4 may be separated from the read and write wiring layer 18 by an interlevel dielectric layer 25. The interlevel dielectric layer 25 may have contacts 26 extending from the doped regions 13, 14 of the SOI layer 4 to the read and write wiring layer 18. The face of the interlevel dielectric layer 25 that is in contact with the face of the read and write wiring layer 18 is typically coplanar with the face of the gate conductor 16 of the FET that is in contact with the at least one gate conductor 16. The interlevel dielectric layer 25 may be separated from the sidewalls of the gate structure 15 by gate sidewall spacers 27 that are adjacent to the gate structure 15. The read and write wiring layer 18 typically includes a dielectric layer 20, a read line 21 and a write line 22. In some embodiments, the read line 21 is in direct contact with the gate conductor 16 of the gate structure 15.

Still referring to FIG. 1, electrical communication is provided through the dielectric layer 3 between the memory device 100 and the logic device 200. In some embodiments, the electrical communication is provided by interconnect wiring 28 that extends from the control gate layer 9 of the gate structure 10 of the memory device 100 into direct contact with an electrically conductive stud 29 that extends from the face of the dielectric layer 3 that the gate structure 10 of the memory device 100 is present on to the write line 22 that is present in the read and write wiring layer 18. Further details regarding the elements of the electronic device that is depicted in FIG. 1 are described in more detail in connection with the description of FIGS. 2-7.

Figure 2:
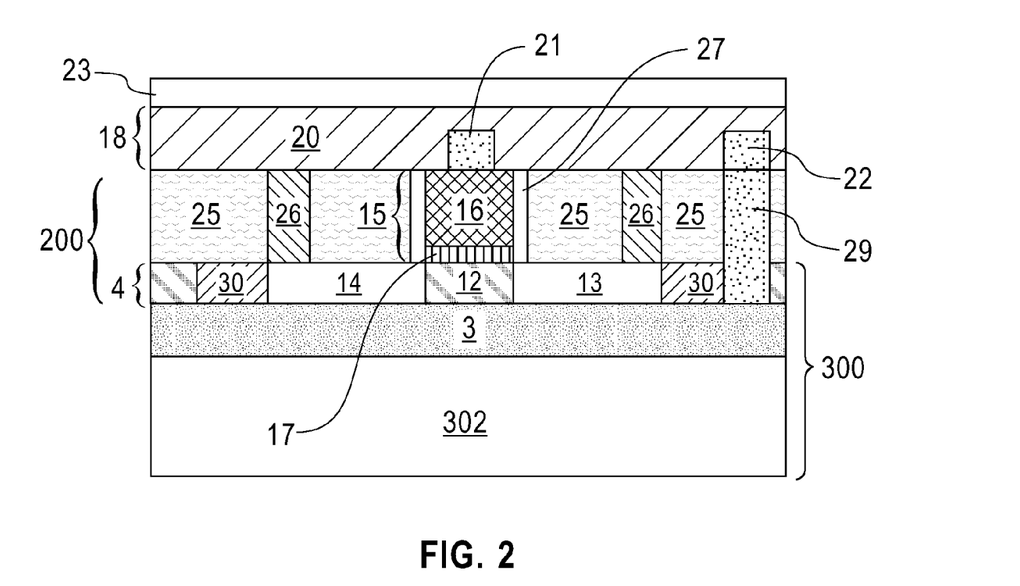
FIG. 2 is a side cross-sectional view of an initial structure including a logic device present on an extremely thin semiconductor on insulator (ETSOI) layer of a transfer substrate, wherein the transfer substrate includes a first handle substrate, a dielectric layer, and an SOI layer that the logic device is formed on, in accordance with one embodiment of the present disclosure.

FIGS. 2-7 depict one embodiment of a method of forming the electronic device that is depicted in FIG. 1. FIG. 2 depicts one embodiment of an initial structure including a logic device 200 present on an extremely thin semiconductor on insulator (ETSOI) layer of a transfer substrate 300. Referring to FIG. 2, the term "extremely thin semiconductor-on-insulator (ETSOI) layer" as used throughout the present disclosure denotes an SOI layer of an SOI substrate whose thickness is from 2 nm to 10 nm. The SOI layer 4 that was previously described with reference to FIG. 1, may provide an ETSOI layer when having a thickness ranging from 2 nm to 10 nm. Therefore, in the following description the SOI layer 4 is hereafter referred to as an ETSOI layer 4. The initial structure further includes a dielectric layer 3 (also referred to as a buried dielectric layer) and a base semiconductor layer 302. The ETSOI layer 4, the dielectric layer 3 and the base handling substrate 302 may be the components of a semiconductor on insulator (SOI) substrate.

Referring to FIG. 2, The ETSOI layer 4 is the uppermost semiconductor layer of the substrate in which semiconductor devices, such as logic devices 200, are typically formed. The ETSOI layer 4 may be composed of any semiconducting material including, but not limited to Si, strained Si, SiC, SiGe, SiGeC, Si alloys, Ge, Ge alloys, GaAs, InAs, and InP, or any combination thereof. In one embodiment, the ETSOI layer 4 is silicon. The ETSOI layer 4 may be thinned to a desired thickness by planarization, grinding, wet etch, dry etch, oxidation followed by oxide etch, or any combination thereof. One method of thinning the ETSOI layer 4 is to oxidize the silicon by a thermal dry or wet oxidation process, and then wet etch the oxide layer using a hydrofluoric acid mixture. This process can be repeated to achieve the desired thickness. In one embodiment, the ETSOI layer 4 has a thickness ranging from 2 nm to 20 nm. In another embodiment, the ETSOI layer 4 has a thickness ranging from 2 nm to 10 nm. In one example, the ETSOI layer 4 has a first thickness that is greater than 20 nm.

Referring to FIG. 2, a dielectric layer 3 (also referred to as buried dielectric layer) may be present under the ETSOI layer 4. The dielectric layer 3 is typically present underlying the ETSOI layer 4 and atop the base semiconductor layer 302. The dielectric layer 3 may be formed by implanting a high-energy dopant into a bulk semiconductor substrate and then annealing the structure to form a buried insulating layer, i.e., dielectric layer 3. In another embodiment, the dielectric layer 3 may be deposited or grown onto the base semiconductor layer 302 prior to the formation of the ETSOI layer 4. In yet another embodiment, the SOI substrate of the ETSOI layer 4, the dielectric layer 3 and the base semiconductor layer 302 may be formed using wafer-bonding techniques, where a bonded wafer pair is formed utilizing glue, adhesive polymer, or direct bonding.

Referring to FIG. 2, the base semiconductor layer 302 may be a semiconducting material including, but not limited to Si, strained Si, SiC, SiGe, SiGeC, Si alloys, Ge, Ge alloys, GaAs, InAs, InP as well as other III/V and II/VI compound semiconductors. The base semiconductor layer 302 may have the same or a different composition than the ETSOI layer. The base semiconductor layer 302 may be referred to as a "first handle substrate". In some examples, the ETSOI layer 4, the dielectric layer 3 and the base semiconductor layer 302 may provide a transfer substrate 300.

Referring to FIG. 2, the logic device 200 is formed on the ETSOI layer 4, in which the channel region 12, and at least a portion of the source region, i.e., doped region 14, and the drain region, i.e., doped region 13, of the logic device 200 is formed in the ETSOI layer 4. In some embodiments, and prior to forming the logic device 200, the ETSOI layer 4 may be patterned and etched to define an active region. The perimeter of the active region may be defined by forming an isolation region, such as a shallow trench isolation (STI) region 30. An STI region 30 may be formed by etching a trench in the ETSOI layer 4 utilizing a dry etching process, such as reactive-ion etching (RIE) or plasma etching. Chemical vapor deposition (CVD) or another like deposition process may then be used to fill the trench with a dielectric material. A planarization process, such as chemical-mechanical polishing (CMP) may optionally be used to provide a planar structure. In some embodiments, the portion of the ETSOI layer 4 that provides the active region may be doped to provide a well region. For clarity, the well regions are not specifically labeled in the drawings of the present application. The dopant for the well regions may be introduced to the ETSOI layer 4 using ion implantation.

In the embodiment that is depicted in FIG. 2, the logic device 200 is a FET. In one example, the gate structure 15 of the FET may be formed on the ETSOI layer 4 using deposition, photolithography and etch processes. In one embodiment, the gate structure 15 may include at least one gate dielectric 17 and at least one gate conductor 16. The material of the at least one gate dielectric 17 can be comprised of a semiconductor oxide, semiconductor nitride, semiconductor oxynitride, or any multilayered stack thereof. In one example, the at least one gate dielectric 17 can be comprised of a semiconductor oxide such as, for example, silicon dioxide. The at least one gate dielectric 17 can also be comprised of a dielectric metal oxide having a dielectric constant that is greater than the dielectric constant of silicon dioxide, e.g., 3.9. In one embodiment, the at least one gate dielectric 17 can comprise a dielectric oxide having a dielectric constant greater than 4.0. In another embodiment, the at least one gate dielectric 17 can be comprised of a dielectric oxide having a dielectric constant of greater than 8.0. Exemplary dielectric oxide materials which have a dielectric constant of greater than 3.9 include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In some embodiments, multilayered stacks of at least two of the above mentioned dielectric materials can be employed as the at least one gate dielectric 17. For example, the at least one gate dielectric 17 can include a stack of, from bottom to top, silicon dioxide and hafnium oxide. The thickness of the at least one gate dielectric 17 may vary depending on the technique used to form the same. In one embodiment, the at least one gate dielectric material 17 has a thickness from 0.5 nm to 10 nm. In another embodiment, the at least one gate dielectric 17 has a thickness from 1.0 nm to 5 nm.

The at least one gate dielectric 17 can be formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes. Alternatively, the at least one gate dielectric 17 can be formed utilizing a thermal process, such as, for example thermal oxidation or thermal nitridation.

The at least one gate conductor 16 can comprise any conductive metal-containing material including, but not limited to, doped polysilicon, doped SiGe, an elemental metal, (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multi-layers thereof. In some embodiments, the at least one gate conductor 16 includes, from bottom to top, a conductive metal and doped polysilicon. The at least one gate conductor 16 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. When a metal silicide is formed, a conventional silicidation process can be employed. When a Si-containing material is employed as the at least one gate conductor 16, a non-doped Si-containing layer can be formed and thereafter a dopant can be introduced into the non-doped Si-containing layer by utilizing one of ion implantation, gas phase doping, or by transferring a dopant from a sacrificial material layer formed in proximity of the non-doped Si-containing layer, and then removing the sacrificial layer from the structure. Alternatively, a doped Si-containing layer can be formed utilizing an in-situ doping deposition process. The gate structure 15 of the at least one gate conductor 16 and the at least one gate dielectric 17 can be formed utilizing any conventional process including, for example, a gate first or a gate last, i.e., replacement gate process. So as not to obscure the present disclosure, the details of such processes are not described herein.

Referring to FIG. 2, the source/drain regions can be formed in the ETSOI layer 4 utilizing an ion implantation process. The source and drain regions for the FET are depicted by a first doped region 13, e.g., drain region, and a second doped region 14, e.g., source region. For example, the source and drain regions, e.g., first doped region 13 and second doped region 14, may include n-type dopants or p-type dopants. As used herein, "p-type" refers to the addition of impurities to an intrinsic semiconductor that creates deficiencies of valence electrons. The first doped region 13 and the second doped region 14 having a p-type conductivity may be formed in a silicon containing ETSOI layer 4 by doping the ETSOI layer 4 with elements from group III-A of the Periodic Table of Elements. In a silicon containing ETSOI layer 4, examples of p-type dopants, i.e., impurities, include but are not limited to boron, aluminum, gallium and indium. As used herein, "n-type" refers to the addition of impurities that contributes free electrons to an intrinsic semiconductor. A first doped region 13 and a second doped region 14 having an n-type conductivity may be formed within a silicon containing ETSOI layer 4 by doping the ETSOI layer 4 with elements from group V-A of the Periodic Table of Elements. In a silicon containing substrate, examples of n-type dopants, i.e., impurities, include but are not limited to, antimony, arsenic and phosphorous. The first and second doped regions 13, 14 that provide the source and drain region of the FET that is formed on the ETSOI layer 4 may extend slightly beneath the edge of the gate structure 15.

Still referring to FIG. 2, gate sidewall spacers 27 may be formed on the sidewalls of the gate structure 15. The gate sidewall spacers 27 may be composed of a dielectric material. In one example, the gate sidewall spacers 27 can be comprised of a dielectric oxide, such as, for example, silicon dioxide, and/or an oxygen-impermeable dielectric material, such as silicon nitride, or a dielectric metallic nitride. The gate sidewall spacers 27 can be formed by deposition, followed by etching.

Although not depicted in the supplied figures, the source and drain regions for the FET may include raised source and drain regions that are located atop the first doped region 13 and the second doped region 14. The raised source and drain regions for the FET can be formed utilizing an epitaxial growth process. Doping of the raised source and drain regions may incur-in-situ (i.e., during the epitaxial growth process) or after the epitaxial growth process by utilizing one of ion implantation, gas phase doping or out-diffusion of a dopant from a sacrificial dopant-containing material. The semiconductor material that forms the raised source and drain regions may include any semiconductor material such as, for example, silicon (Si), germanium (Ge), and silicon germanium (SiGe). In one embodiment, the semiconductor material that forms the raised source and drain regions includes a same semiconductor material as that of the ETSOI layer 4. In another embodiment, the semiconductor material that forms the raised source and drain region includes a different semiconductor material as that of the ETSOI layer 4. It is noted that the specific material compositions for the semiconductor material that forms the raised source and drain regions are provided for illustrative purposes only, and are not intended to limit the present disclosure, as any semiconductor material may be formed using an epitaxial growth process.

An interlevel dielectric layer 25 may be blanket deposited atop the ETSOI layer 4 and the gate structure 15 that is formed atop the ETSOI layer 4, and contacts 26 may be formed extending through the interlevel dielectric layer 25 to the first and second doped regions 13, 14, i.e., source and drain region of the FET. The interlevel dielectric layer 25 and the contacts 26 can be formed utilizing any back-end-of-the-line process including, for example, a single damascene or a dual damascene process. The at least one interlevel dielectric layer 25 comprises an interconnect dielectric material including, for example, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. The at least one interlevel dielectric layer 25 can be porous or non-porous. In one embodiment, at least one interlevel dielectric layer 25 has a dielectric constant that is about 4.0 or less. In another embodiment, the at least one interlevel dielectric layer 25 has a dielectric constant of about 2.8 or less. All dielectric constants mentioned herein are relative to a vacuum, unless otherwise noted.

The contacts 26 are comprised of a conductive metal such as, for example, Cu, W, Al, and alloys thereof. Openings for the contacts 26 may be formed in the intralevel dielectric layer 25 using photolithography and etch processes. The etch process for forming the openings may remove the material of the interlevel dielectric layer 25 selectively to the portions of the ETSOI layer 4 containing the first and second doped regions 13, 14. The metal is formed into the openings in the interlevel dielectric layer 25 for the contacts 26 via a deposition process including, e.g., chemical vapor deposition, plasma enhanced chemical vapor deposition, sputtering, and plating. A planarization process may be applied so that the surface of the contacts 26 opposite the surface that is in contact with the first doped region 13 and the second doped region 14 is coplanar with the upper surface of the gate structure 15 and an upper surface of the interlevel dielectric layer 25, as depicted in FIG. 2B.

Referring to FIG. 2B, an electrically conductive stud 29 may be formed through at least the interlevel dielectric layer 25. In some embodiments, the electrically conductive stud 29 may also extend through the ETSOI layer 4. Similar to the contacts 26 to the first and second doped regions 13, 14, the electrically conductive stud 29 may be composed of a metal. For example, the electrically conductive stud 29 may be composed of a metal, such as Cu, W, Al, and alloys thereof. The electrically conductive stud 29 can be formed by etching an opening through the interlevel dielectric layer 25, and optionally through the ETSOI layer 4, and then filling the opening with an electrically conductive material. The electrically conductive stud 29 may be positioned to be contacted by one of the later formed read line 21 or write line 22 in the read and write wiring layer 18.

A read and write wiring layer 18 may also be present in contact with the logic device 200 that is present on the ETSOI layer 4. The read and write wiring layer 18 may include a dielectric layer 20, a read line 21 and a write line 22. In the embodiment that is depicted in FIG. 2B, the read line 21 is formed in electrical contact with the at least one gate conductor 16 of the gate structure 15. In some embodiments, the read line 21 and the write line 22 may be formed using a printing method, or may be formed using deposition, photolithography and etching process sequence. The read line 21 and the write line 22 may be composed of a metal, such as Cu, W, Al, and alloys thereof. Following formation of the read line 21 and the write line 22, the dielectric layer 20 may be formed isolating the read line 21 from the write line 22 where applicable. The dielectric layer 20 may be any suitable dielectric material such as, for example, SiC, $Si_4NH_3$, $SiO_2$, a carbon doped oxide, a nitrogen and hydrogen doped silicon carbide SiC (N,H) or multilayers thereof. Any conventional deposition process such as, e.g., chemical vapor deposition, plasma enhanced chemical vapor deposition, chemical solution deposition, evaporation, and atomic layer deposition may be used in forming the dielectric layer 20 that covers the read line 21 and the write line 22 of the read and write wiring layer 18.

In some embodiments, an interconnect layer 23 may be present on the surface of the read and write layer 18 that is opposite the surface of the read and write layer 18 that is in contact with the interlevel dielectric layer 25.

Figure 3:
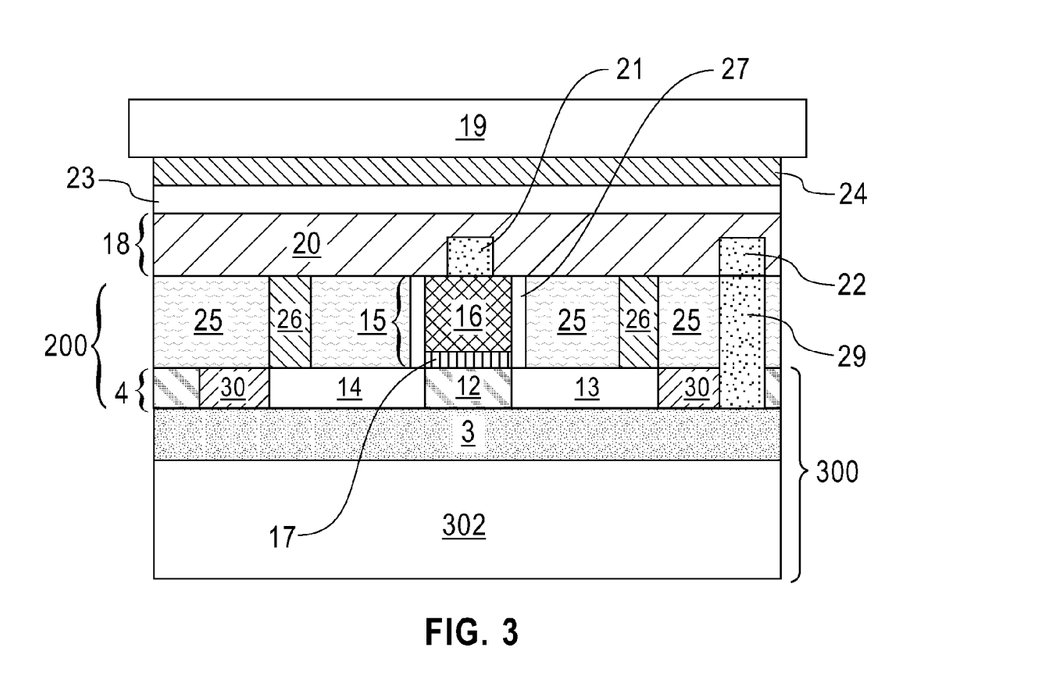
FIG. 3 is a side cross-sectional view of contacting a second handle substrate to the SOI layer of the transfer substrate that includes the logic device, in accordance with one embodiment of the present disclosure.

FIG. 3 depicts one embodiment of contacting a handle substrate 19 to the ETSOI layer 4 of the transfer substrate 300 that includes the logic device 200. The handle substrate identified by reference number 19 is hereafter referred to as a second handle substrate 19. In the embodiment that is depicted in FIG. 3, the second handle substrate 19 is contacted to the logic device 200 that is present on the ETSOI layer 4 through a stressor layer 24. In some embodiments, the stressor layer 24 is contacted directly to the interconnect layer 23 that is present overlying the logic device 200. In some embodiments, in which the interconnect layer 23 is omitted, the stressor layer 24 may be contacted directly to the read and write wiring layer 18.

In some embodiments (not shown), an optional metal-containing adhesion layer can be formed on exposed surface of the interconnect layer 23, or the read and write wiring layer 18 when the interconnect 23 is omitted, prior to forming the stressor layer 24 so as to improve the adhesion of the stressor layer 24 to the surface that it is contacted to, e.g., the interconnect layer 23 or the read and write wiring layer 18. Typically, the optional metal-containing adhesion layer is employed when a stressor layer 24 comprised of a metal is employed. In some embodiments, an optional plating seed layer (also not shown) can be formed directly atop exposed surface of the interconnect layer 23 prior to forming the stressor layer 24. In other embodiments, both optional layers, i.e., a metal-containing adhesion layer and a plating seed layer can be used and formed prior to the stressor layer 24.

The optional metal-containing adhesion layer that may be employed in the present disclosure includes any metal adhesion material such as, but not limited to, Ti/W, Ti, Cr, Ni or any combination thereof. The optional metal-containing adhesion layer may comprise a single layer or it may include a multi-layered structure comprising at least two layers of different metal adhesion materials. The optional metal-containing adhesion layer can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

The optional metal-containing adhesion layer and/or the optional plating seed layer is (are) formed at a temperature which does not effectuate spontaneous spalling to occur within the base semiconductor layer 302. By "spontaneous" it is meant that the removal of a thin material layer from the base semiconductor layer 302 occurs without the need to employ any manual means to initiate crack formation and propagation for breaking apart a thin material layer from the base semiconductor layer 302. By "manual" it is meant that crack formation and propagation are explicit for breaking apart the thin material layer from the base semiconductor layer 302. Stressor layer 24 that can be employed in the present disclosure includes any material that is under tensile stress at the spalling temperature. As such, the stressor layer 24 can also be referred to herein as a stress-inducing layer. In accordance with the present disclosure, the stressor layer 24 has a critical thickness and stress value that cause spalling mode fracture to occur within the base semiconductor layer 302. By "spalling mode fracture" it is meant that a crack is formed within base semiconductor layer 302 and the combination of loading forces maintain a crack trajectory at a depth below the uppermost surface of the base semiconductor layer 302. By "critical condition", it is meant that for a given stressor material and semiconductor base material combination, a thickness value and a stressor value for the stressor layer is chosen that render spalling mode fracture possible. The spalling process, conditions for spalling, and materials for spalling can include those mentioned within co-pending and commonly owned U.S. Patent Application Publication Nos. 2010/0307572, and 2010/0311250, the entire contents of which are incorporated herein by reference.

Illustrative examples of materials that are under tensile stress when applied atop the base semiconductor layer 302 and thus can be used as the stressor layer 24 include, but are not limited to, a metal, a polymer, such as a spall inducing tape layer, or any combination thereof. The stressor layer 24 may comprise a single stressor material, or a multilayered stressor structure including at least two layers of different stressor material can be employed. In one embodiment, the stressor layer 24 is a metal. In another embodiment, the stressor layer 24 is a spall inducing tape. In another embodiment, for example, the stressor layer 24 may comprise a two-part stressor layer including a lower part and an upper part. The upper part of the two-part stressor layer can be comprised of a spall inducing tape layer.

When a metal is employed as the stressor layer 24, the metal can include, for example, Ni, Cr, Mo, and/or W. Alloys of these metals can also be employed. In one embodiment, the stressor layer 24 includes at least one layer consisting of Ni. When a polymer is employed as the stressor layer 24, the polymer is a large macromolecule composed of repeating structural units. These subunits are typically connected by covalent chemical bonds. Illustrative examples of polymers that can be employed as the stressor layer 24 include, but are not limited to, polyimides polyesters, polyolefins, polyacrylates, polyurethane, polyvinyl acetate, and polyvinyl chloride.

In one embodiment and when the stressor layer 24 is a metal or polymer, the stressor layer 24 can be formed by a deposition process, such as, for example, dip coating, spin-coating, brush coating, sputtering, chemical vapor deposition, plasma enhanced chemical vapor deposition, chemical solution deposition, physical vapor deposition, and/or plating. When the stressor layer 24 is a spall inducing tape layer, the spall inducing tape layer can be applied by hand or mechanical means.

If the stressor layer 24 is of a metallic nature, it typically has a thickness within a range from 3 µm to 50 µm, with a thickness within a range from 4 µm to 10 µm being more typical. Other thicknesses for a metallic stressor material that are below and/or above the aforementioned thickness ranges can also be employed in the present disclosure. If the stressor layer 24 is of a polymeric nature, it typically has a thickness in a range from 10 µm to 200 µm, with a thickness within a range from 50 µm to 100 µm being more typical. Other thicknesses for a polymeric stressor material that are below and/or above the aforementioned thickness ranges can also be employed in the present disclosure.

In some embodiments, the stressor layer 24 is formed directly on M1-MX layer 23, or is formed directly on the read and write wiring layer 18, when the M1-MX layer 23 is omitted. After forming the stressor layer 24, a flexible handle layer 19 can be formed on an exposed surface of the stressor layer 24. The flexible handle layer 19 employed in the present disclosure comprises any flexible material, which has a minimum radius of curvature that is typically less than 30 cm. Illustrative examples of flexible materials that can be employed as the flexible handle layer 19 include a metal foil or a polyimide foil. Alternatively, a tape as described above can be used as the flexible handle layer 19. The flexible handle layer 19 can be used to provide better fracture control and more versatility in handling the spalled portion of the base semiconductor layer 302. Moreover, the flexible handle layer 19 can be used to guide the crack propagation during spalling. The flexible handle layer 19 of the present disclosure is typically, but not necessarily, formed at a temperature proximate to room temperature, e.g., from 15° C. to 40° C. The flexible handle layer 19 typical has a thickness of from 1 µm to few mm, with a thickness of from 70 µm to 120 µm being more typical. Other thicknesses for the flexible handle layer 19 that are below and/or above the aforementioned thickness ranges can also be employed in the present disclosure.

Figure 4:
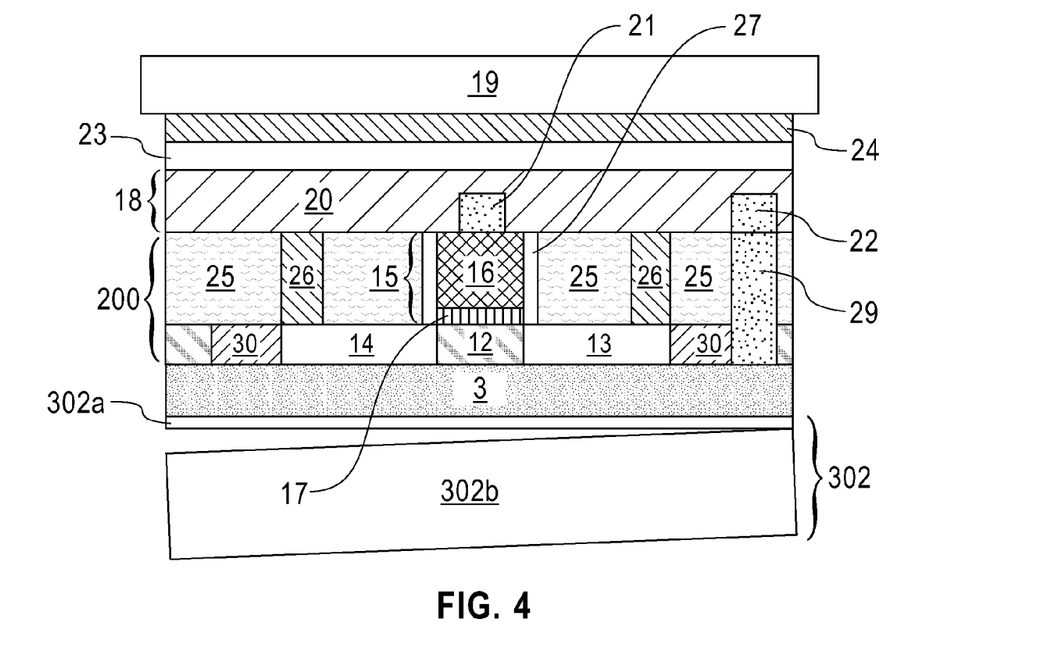
FIGS. 4 and 5 are side cross-sectional views depicting removing the first handle substrate to expose the dielectric layer.

Referring to FIG. 4, a controlled spalling process can be performed in which a portion of the base semiconductor layer 302 is removed. The portion of the base semiconductor layer 302b, which is no longer attached to the dielectric layer 3 can be referred to as herein as a non-spalled portion of semiconductor base layer 302b. The portion of the semiconductor base layer 302a that remains attached to the at least one buried dielectric material layer 14 can be referred to herein as a spalled semiconductor base material layer 302a. In one embodiment of the present disclosure, the spalled semiconductor base material layer 302a that can remain attached to the at least one buried dielectric material layer 3 can have a thickness of less than 100 microns. In another embodiment, the spalled semiconductor base material layer 302a that can remain attached to the at least one dielectric material layer 3 can have a thickness of less than 50 microns.

Spalling can be initiated at room temperature or at a temperature that is less than room temperature. In one embodiment, spalling is performed at room temperature (i.e., 20° C. to 40° C.). In another embodiment, spalling is performed at a temperature less than 20° C. In a further embodiment, spalling occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, the less than room temperature spalling process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas. When spalling is performed at a temperature that is below room temperature, the spalled structure is returned to room temperature by allowing the spalled structure to slowly warm up to room temperature by allowing the same to stand at room temperature. Alternatively, the spalled structure can be heated up to room temperature utilizing any heating means.

Figure 5:
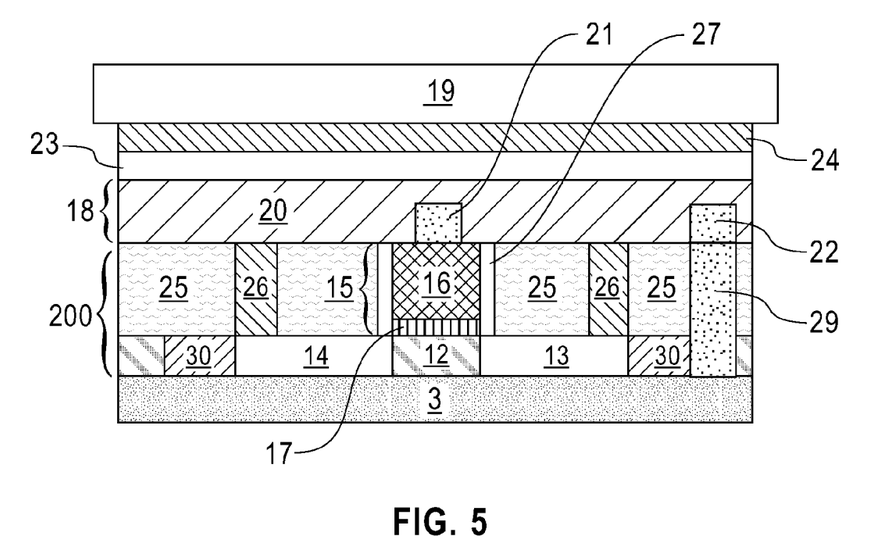

Reference is now made to FIG. 5, which illustrates the structure of FIG. 4 after removing the spalled semiconductor base material layer 302a that remains attached to the dielectric layer 3. The spalled semiconductor base material layer 302a can be removed using an etch process that is selective to the dielectric layer 3, or the spalled semiconductor base material layer 302a can be removed using a planarization process, such as chemical mechanical planarization (CMP). In lieu of spalling, a standard etching process, and/or a planarization process, such as chemical mechanical polishing and/or grinding can be used for removing the base semiconductor layer 302.

Figure 6:
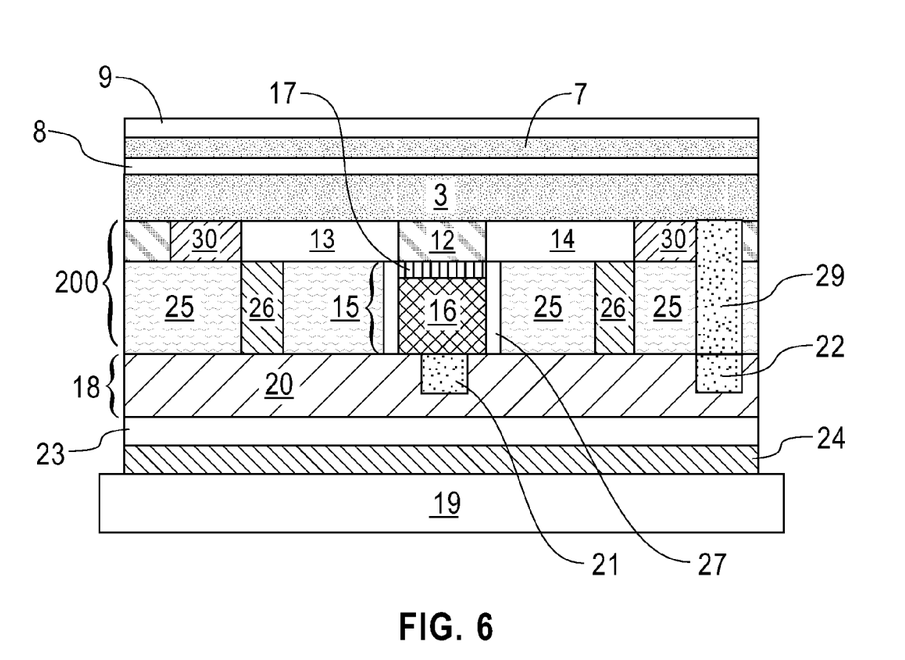
FIG. 6 is a side cross-sectional view depicting one embodiment of forming a gate stack of a memory device on the exposed surface of the dielectric layer, in which the gate stack includes a floating gate layer, a control dielectric layer on the floating gate layer, and a control gate layer, in accordance with one embodiment of the present disclosure.
Figure 7:
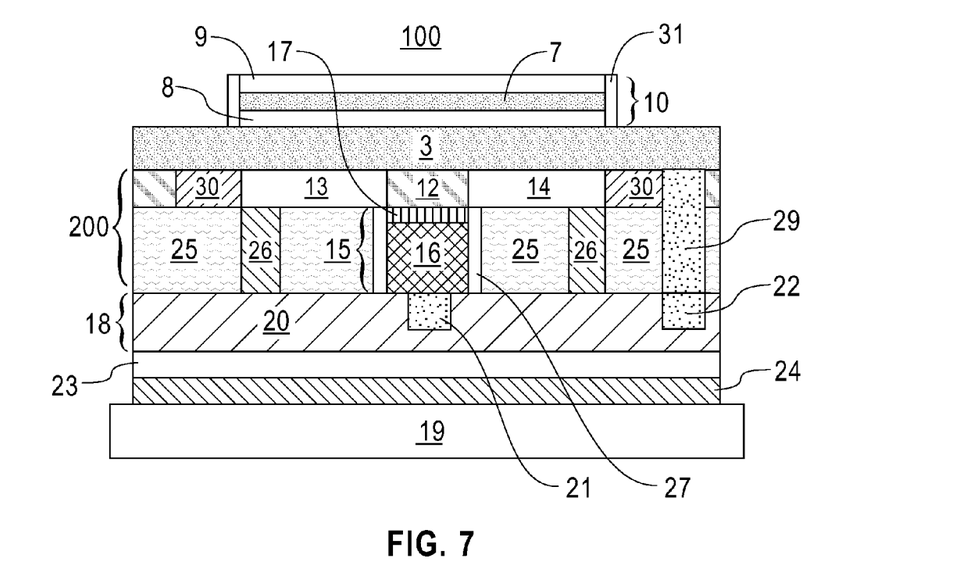
FIG. 7 is a side cross-sectional view depicting patterning and etching the gate stack to provide the gate of the memory device.

FIGS. 6 and 7 depict one embodiment of forming a gate structure 10 of a memory device 100 on the exposed surface of the dielectric layer 3. The gate structure 10 includes a floating gate layer 8 that is present on the dielectric layer 3, a control dielectric layer 7 on the floating gate layer 8, and a control gate layer 9 that is present on the control dielectric layer 7. In FIGS. 6 and 7, the structure depicted in FIG. 5 is rotated 180°.

FIG. 6 depicts one embodiment of forming a gate stack on the dielectric layer 3. The floating gate layer 8 typically comprises a conductive material, such as a doped semiconductor material, a conductive metallic nitride, a metallic material, or a combination thereof. Exemplary doped semiconductor materials include doped polysilicon, a doped silicon-containing semiconductor alloy, silicon nanocrystals, germanium nanocrystals, etc. Exemplary conductive metallic nitrides include, but are not limited to, TaN, TiN, WN, TiAlN, TaCN, other conductive refractory metal nitrides, or alloys thereof. Exemplary metallic materials include elemental metals and intermetallic alloys. The thickness of the floating gate layer 8 may be from about 200 nm to about 1,500 nm, although lesser and greater thicknesses are also contemplated herein explicitly. The floating gate layer 8 may be depositing using physical vapor deposition (PVD), such as sputtering or plating, or may be deposited using chemical vapor deposition (CVD).

The control dielectric layer 7 may comprise a semiconductor-based dielectric material such as silicon oxide, silicon nitride, silicon oxynitride, and/or a stack thereof. The control dielectric layer 7 may be formed by chemical vapor deposition (CVD). Alternately, the control dielectric layer 7 may comprise a high-k dielectric material such as $HfO_2$, $ZrO_2$, $La_2O_3$, $Al_2O_3$, $TiO_2$, $SrTiO_3$, $LaAlO_3$, $Y_2O_3$, an alloy thereof, and a silicate thereof. The high-k dielectric material may be formed by methods well known in the art including, for example, a chemical vapor deposition (CVD), an atomic layer deposition (ALD), molecular beam epitaxy (MBE), pulsed laser deposition (PLD), liquid source misted chemical deposition (LSMCD), physical vapor deposition (PVD) and combinations thereof. The thickness of the control dielectric layer 7 may be from about 1 nm to about 6 nm in the case of a conventional dielectric material, and from about 2 nm to about 12 nm in the case of the high-k dielectric material.

The control gate layer 9 may be formed on the control dielectric layer 7. The control gate layer 9 typically comprises a conductive material, such as a doped semiconductor material, a conductive metallic nitride, a metallic material, or a combination thereof. Exemplary doped semiconductor materials include doped polysilicon, a doped silicon-containing semiconductor alloy, silicon nanocrystals, germanium nanocrystals, etc. Exemplary conductive metallic nitrides include, but are not limited to, TaN, TiN, WN, TiAlN, TaCN, other conductive refractory metal nitrides, or alloys thereof. Exemplary metallic materials include elemental metals and intermetallic alloys. The control gate layer 9 may be depositing using physical vapor deposition (PVD), such as sputtering or plating, or may be deposited using chemical vapor deposition (CVD). The thickness of the control gate layer 9 may be from about 80 nm to about 1,000 nm, and typically from about 120 nm to about 400 nm, although lesser and greater thicknesses are also contemplated herein.

FIG. 7 depicts one embodiment of patterning and etching the gate stack of the control gate layer 9, the control gate dielectric 7 and the floating gate layer 8 to provide the gate structure 10 of the memory device 100. In one embodiment, the gate structure 10 of the memory device 100 is formed by applying a photoresist layer over the control gate layer 9, and lithographically patterning the photoresist layer to form an etch mask protecting the portion of the gate stack that provides the gate structure 10. The portions of the control gate layer 9, the control gate dielectric 7 and the floating gate layer 8 that are not protected by the etch mask may be removed by an anisotropic etch, such as reactive ion etch, that is selective to the dielectric layer 3. Following the anisotropic etch, the remaining portion of the gate stack provide the gate structure 10 to the memory device 100. In the embodiment depicted in FIG. 7, a spacer 31 may be formed on the sidewalls of the gate structure 10. The spacer 31 may be composed of a dielectric material, such as an oxide, nitride or oxynitride dielectric. In one example, the spacer 31 is composed of silicon oxide. In another example, the spacer 31 is composed of silicon nitride. The spacer 31 may be formed using deposition and etch processes.

Following formation of the spacer 31, interconnect wiring 28 may be formed connecting the logic device 200 with the memory device 100, as depicted in FIG. 1. The interconnect wiring 28 may extend from an exposed surface of the control gate layer 9 to the electrically conductive stud 29 that is present through the dielectric layer 3. The interconnect wiring 28 may be present on the exterior sidewall of the spacer 31. In some embodiments, before the interconnect wiring 28 is formed, an opening is formed in the dielectric layer 3 to expose a portion of the electrically conductive stud 29. The opening may be formed in the dielectric layer using photolithography and etch processes. More specifically, a pattern is produced by applying a photoresist to the surface to be etched, exposing the photoresist to a pattern of radiation, and then developing the pattern into the photoresist utilizing a resist developer to provide a photoresist etch mask. Once the patterning of the photoresist etch mask is completed, the sections covered by the photoresist are protected while the exposed regions are removed using a selective etching process that removes the unprotected regions. In one example, the opening may be formed by etching a trench in the ETSOI layer 4 utilizing a dry etching process, such as reactive-ion etching (RIE) or plasma etching, that is selective to the photoresist etch mask. The opening may then be filled with an electrically conductive material that is formed in direct contact with the electrically conductive stud 29. The material that fills the opening, as well as provides the interconnect wiring 28, may be a metal, such as copper, aluminum, silver, nickel, tungsten, platinum or tantalum. In other embodiments, the material that fills the opening, as well as provides the interconnect wiring 28, may be a conductive metal nitride. Exemplary conductive metallic nitrides include, but are not limited to, TaN, TiN, WN, TiAlN, TaCN, other conductive refractory metal nitrides, or alloys thereof. Exemplary metallic materials include elemental metals and intermetallic alloys. The composition of the interconnect wiring 28 may be the same or different than the composition of the electrically conductive stud 29. The interconnect wiring 28 may be deposited using chemical vapor deposition, such as plasma enhanced chemical vapor deposition, or physical vapor deposition, such as sputtering or plating.

Figure 8:
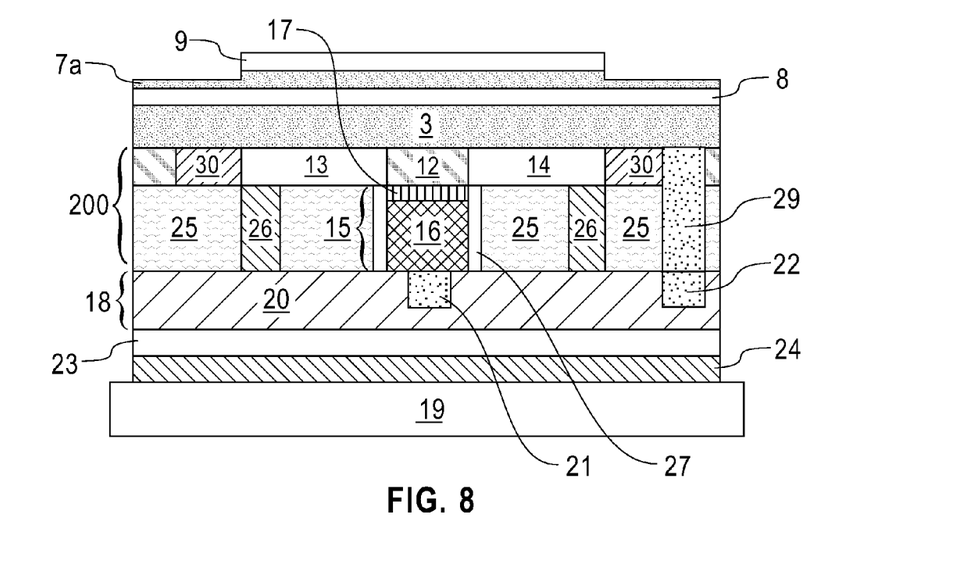
FIG. 8 is a side cross-sectional view depicting another embodiment of the present disclosure that includes patterning the control gate layer and a portion of the control dielectric layer of a gate stack of a memory device, in accordance with one embodiment of the present disclosure.
Figure 9:
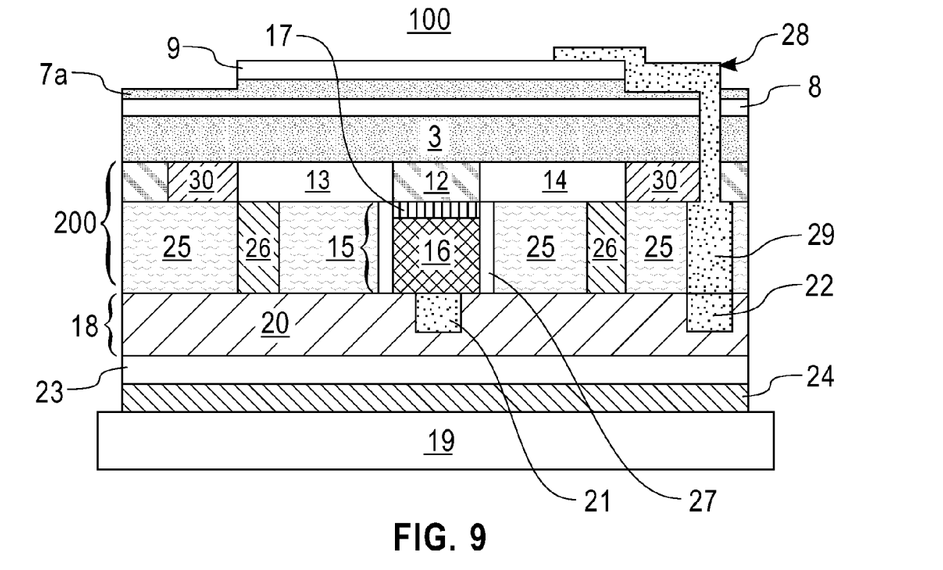
FIG. 9 is a side cross-sectional view depicting forming interconnect wiring connecting the control gate layer to the electrically conductive stud that is depicted in FIG. 8, in accordance with one embodiment of the present disclosure.

FIGS. 8 and 9 depict another embodiment of a method of forming an electronic device that includes a logic device 200 and a memory device 100 on the same semiconductor substrate. FIG. 8 depicts etching the control gate layer 9 and partially etching the control dielectric layer 7a of the gate stack that is depicted in FIG. 6. The etch process depicted in FIG. 8 is applied to the structure that is produced by the process sequence depicted in FIGS. 1-6, as described above. In the embodiment that is depicted in FIG. 8, the etch process that defines the control gate layer 9 stops on the control dielectric layer 7a. The portion of the control dielectric layer 7a that is present under the remaining portion of the control gate layer 9 has its original thickness, but a portion of the control dielectric layer 7a that is not underlying the control gate layer 9 is etched to have a thickness that is less than the original thickness of the control dielectric layer 7a. After etching the control dielectric layer 7a, the interconnect wiring 28 may be formed connecting the logic device 200 with the memory device 100, as depicted in FIG. 8. The interconnect wiring 28 may extend from an exposed surface of the control gate layer 8 through the etched portion of the control dielectric layer 7a to the electrically conductive stud 29 that is present through the dielectric layer 3. The interconnect wiring 28 that is depicted in FIG. 8 is similar to the interconnect wiring 28 that is depicted in FIG. 1. Therefore, further details regarding forming the interconnect wiring 28 that is depicted in FIG. 8 may be found in the above description of the interconnect wiring 28 that is depicted in FIG. 1.

Figure 10:
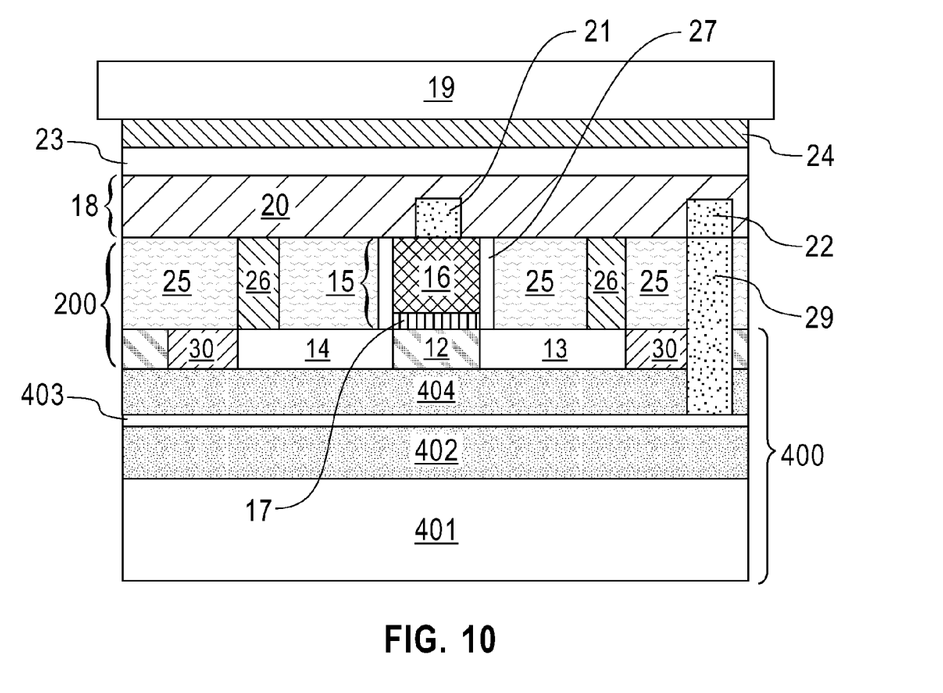
FIG. 10 is a side cross-sectional view of an initial structure used in another embodiment of forming a logic device and a memory device, wherein the initial structures include a logic device present on an extremely thin semiconductor on insulator (ETSOI) layer of a transfer substrate, wherein the transfer substrate includes a first handle substrate, a first dielectric layer, a floating gate layer, a semiconductor on insulator (SOI) layer, and a second dielectric layer, in which a second handle substrate has been attached to the SOI layer containing the logic device, in accordance with one embodiment of the present disclosure.

FIGS. 10-15 depict yet another embodiment of a method of forming an electrical device that includes a logic device 200 and a memory device 100 on the same substrate. FIG. 10 depicts one embodiment of an initial structure used in forming the logic device 200 and a memory device 100. The logic device 200 is present on the ETSOI layer 4 of a transfer substrate 400. In this embodiment, the transfer substrate 400 includes a first handle substrate 401, a first dielectric layer 402, a floating gate layer 403, a second dielectric layer 404 and an ETSOI layer 4. The ETSOI layer 4 of the transfer substrate 400 that is depicted in FIG. 10 is similar to the ETSOI layer 4 of the transfer substrate 300 that is depicted in FIG. 2. Similarly, the logic device 200 that is depicted in FIG. 10, as well as the interlevel dielectric layer 25, contacts 26, read and write wiring level 18, and interconnect layer 23, are similar to the logic device 200, interlevel dielectric layer 25, contacts 26, read and write wiring level 19 and M1-MX layer 23 that are depicted in FIG. 2.

The first and second dielectric layers 402, 404 of the transfer substrate 400 may be composed of any dielectric material. The second dielectric layer 404 is similar to the dielectric layer 3, e.g., buried dielectric layer, that is depicted in FIG. 2. Therefore, the description of the dielectric layer 3 that is depicted in FIG. 2 is suitable for the first dielectric layer 404 that is depicted in FIG. 10. The composition of the first dielectric layer 402 that is depicted in FIG. 10 is similar to the control dielectric layer 7 that is depicted in FIG. 6. Therefore, the description of the composition and the thickness of the control dielectric layer 7 that is depicted in FIG. 6 is suitable for the description of the composition and thickness of the first dielectric layer 402 that is depicted in FIG. 10.

Referring to FIG. 10, the first dielectric layer 402 and the second dielectric layer 404 of the transfer substrate 400 are separated by a floating gate layer 403. The floating gate layer 403 that is depicted in FIG. 10 is similar to the floating gate layer 8 that is depicted in FIG. 6. Therefore, the description of the composition and thickness of the floating gate layer 8 that is depicted in FIG. 6 is suitable for providing further description of the floating gate layer 403 that is depicted in FIG. 10.

The first handle substrate 401 that is depicted in FIG. 10 is similar to the base semiconductor layer 302 that is depicted in FIG. 1. Therefore, the description of the base semiconductor layer 302 that is depicted in FIG. 1 can provide the description of the first handle substrate 401.

The first handle substrate 401, the first dielectric layer 402, the floating gate layer 403, the second dielectric layer 404 and the ETSOI layer 4 of the transfer substrate 400 may be formed using a deposition process, such as chemical vapor deposition. In other embodiments, the dielectric layers, i.e., first and second dielectric layers 402, 403, are formed using a thermal growth process. In yet another embodiment, some of the layers within the transfer substrate 400 are provided by layer transfer processes.

In some embodiments, an electrically conductive stud 29 is present extending through the interlevel dielectric layer 25, the ETSOI layer 4, and the second dielectric layer 404. The electrically conductive stud 29 that is depicted in FIG. 10 is similar to the electrically conductive stud 29 that is depicted in FIG. 2. Therefore, the description of the composition and method of making the electrically conductive stud 29 that is made above with reference to FIG. 2 is applicable to the electrically conductive stud 29 that is depicted in FIG. 10.

FIG. 10 further depicts a second handle substrate 19 (also referred to as "flexible handle layer 19") that is attached to the logic device 200 and the ETSOI layer 4. More specifically, in some embodiments, the second handle substrate 19 may be attached to the read and write wiring layer 18 that is present overlying the logic device 200 through a interconnect layer 23, and a stressor layer 24. The interconnect layer 23 and the stressor layer 24 have been described above with reference to FIGS. 2 and 3. Further details regarding bonding of the second handle substrate 19 to the logic device 200 are also provided above in the description of FIG. 3.

Figure 11:
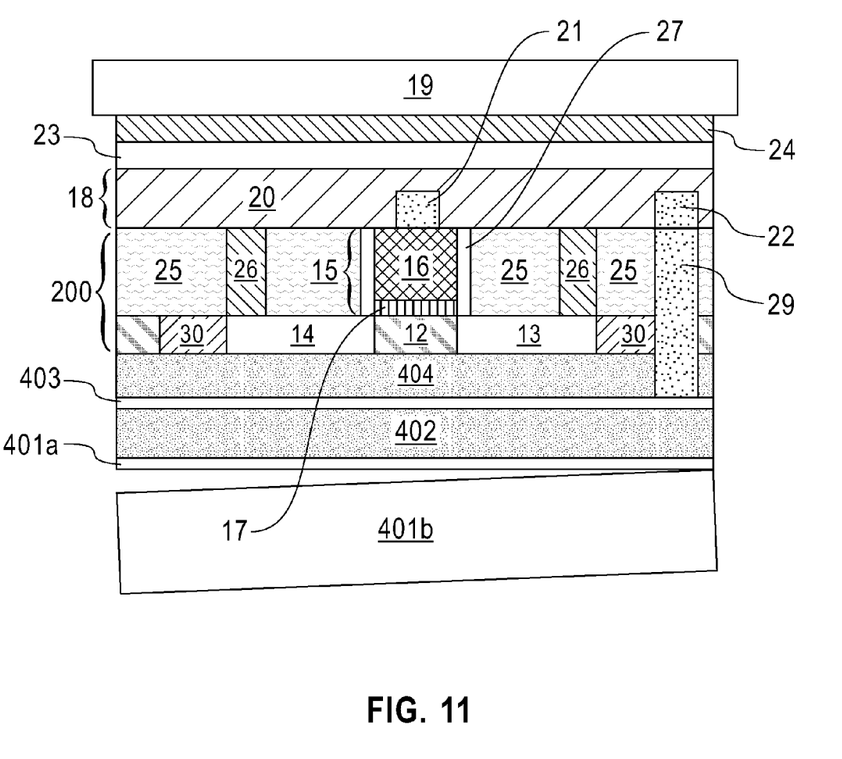
FIG. 11 is a side cross-sectional view depicting removing a portion of the first handle substrate, wherein a remaining portion of the first handle substrate is present on the dielectric layer, in accordance with one embodiment of the present disclosure.

FIG. 11 depicts removing a portion of the first handle substrate 401b, wherein a remaining portion of the first handle substrate 401a is present on the first dielectric layer 402. The portion of the first handle substrate 401b that is removed may be separated from the remaining portion of the first handle substrate 401a by a spalling method, as described above with reference to FIG. 4.

Figure 12:
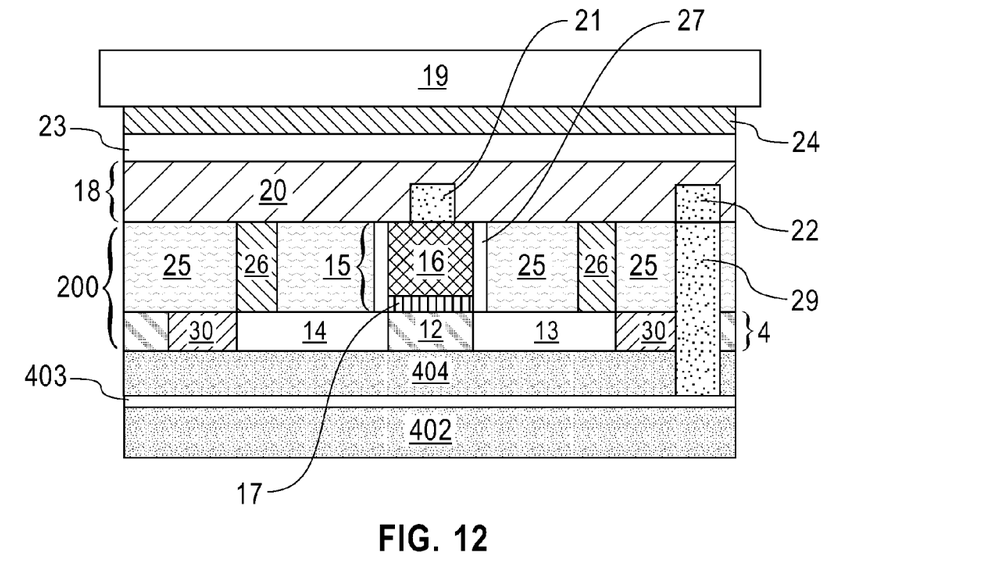
FIG. 12 is a side cross-sectional view removing the remaining portion of the first handle substrate from the structure depicted in FIG. 11 to expose the first dielectric layer, in accordance with one embodiment of the present disclosure.

FIG. 12 depicts removing the remaining portion of the first handle substrate 401a from the structure depicted in FIG. 11 to expose the first dielectric layer 402. The remaining portion of the first handle substrate 401a may be removed by a planarization process, as described above with reference to FIG. 4.

Figure 13:
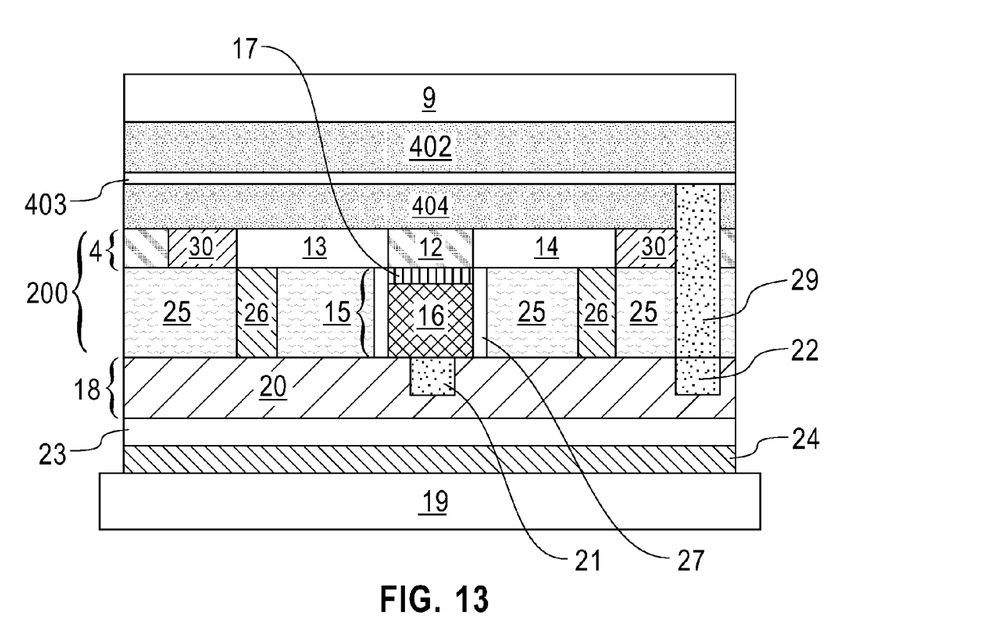
FIG. 13 is a side cross-sectional view depicting one embodiment of forming a control gate layer on the first dielectric layer of the structure depicted in FIG. 12.

FIG. 13 depicts one embodiment of forming a control gate layer 9 on the first dielectric layer 402. The control gate layer 9 is similar to the control gate layer 9 of the gate stack that is depicted in FIG. 6. Therefore, the description of the control gate layer 9 that is depicted in FIG. 6 is suitable for the control gate layer 9 that is depicted in FIG. 13. The structure depicted in FIG. 13 has been rotated 180° from the position depicted in FIG. 12.

Figure 14:
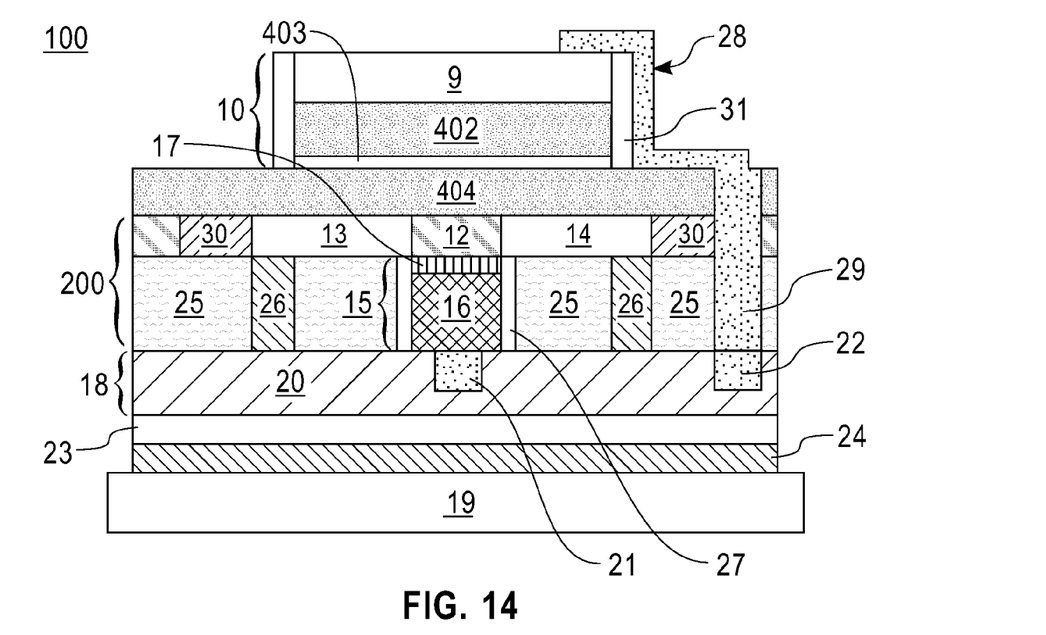
FIG. 14 is a side cross-sectional view depicting patterning the stack of the control gate layer, the first dielectric layer and the floating gate layer to provide the gate structure of a memory device, and forming interconnect wiring from the control gate layer to an electrically conductive stud that is present extending through the second dielectric layer.

FIG. 14 depicts patterning the stack of the control gate layer 9, the first dielectric layer 402 and the floating gate layer 403 to provide the gate structure of a memory device 100. In one embodiment, the stack of the control gate layer 9, the first dielectric layer 402 and the floating gate layer 403 may be patterned using photolithography and etch processes. Patterning the stack of the control gate layer 9, the first dielectric layer 402 and the floating gate layer 403 that are depicted in FIG. 14 is similar to patterning the gate stack of the control gate layer 9, the control dielectric layer 3 and the floating gate layer 8 that is depicted in FIG. 7. Therefore, the description of patterning and etching the gate stack that is depicted in FIG. 7 is suitable for patterning and etching the gate stack that is depicted in FIG. 14. The remaining portion of the gate stack following etching provide the gate structure 10 of the memory device 100. In the embodiment depicted in FIG. 14, the control dielectric layer of the gate structure 10 is provided by the first dielectric layer 402. FIG. 14 further depicts forming a spacer 31 on the sidewalls of the gate structure 10.

FIG. 14 also depicts forming interconnect wiring 28 from the control gate layer 9 of the gate structure 10 to the electrically conductive stud 29 that is present extending through the second dielectric layer 404. The interconnect wiring 28 that is depicted in FIG. 14 is similar to the interconnect wiring 28 that is depicted in FIG. 1. Therefore, the description of the interconnect wiring 28 that is depicted in FIG. 1 is suitable for the description of the interconnect wiring that is depicted in FIG. 14.

Figure 15:
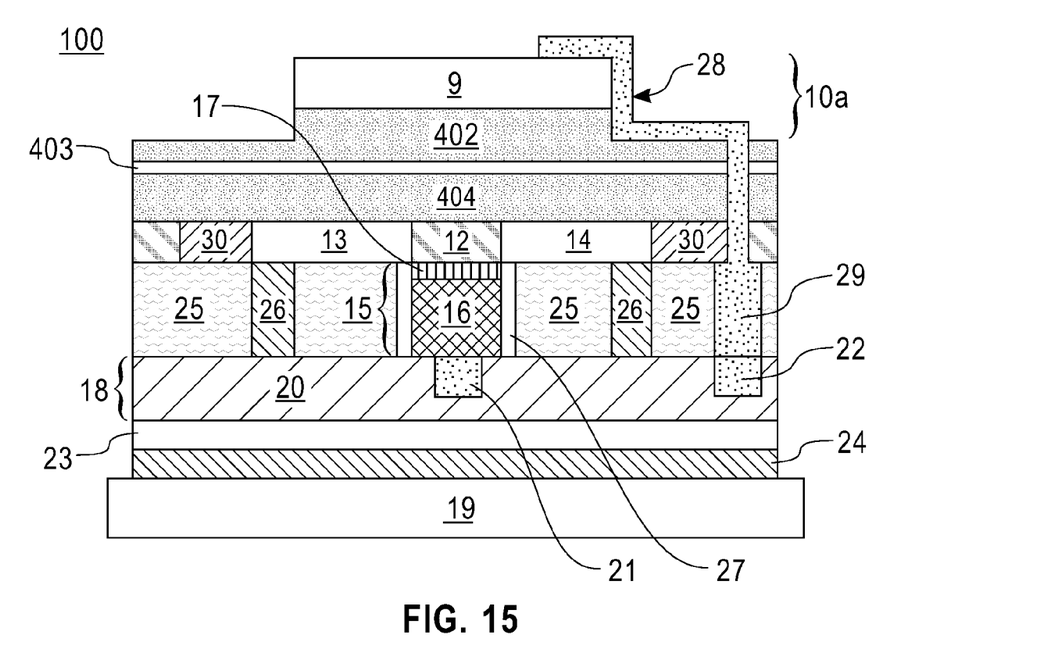
FIG. 15 is a side cross-sectional view of another embodiment that includes patterning the stack of the control gate layer and the first dielectric layer to provide the gate structure of a memory device, and forming interconnect wiring from the control gate layer to an electrically conductive stud that is present extending through the second dielectric layer.

FIG. 15 depicts another embodiment of the present disclosure. In FIG. 15, the pattern and etch process that forms the gate structure 10a of the memory device 100 etches only a portion of the thickness of the first dielectric layer 402. More specifically, following etching of the gate stack 10a, the portion of the first dielectric layer 402 that is present underlying the remaining portion of the control gate layer 9 has its original thickness, while the portions of the first dielectric layer 402 that are not present under the remaining portion of the control gate layer 9 have a reduced thickness. The gate structure 10a of the memory device 100 that is depicted in FIG. 15 is similar to the gate structure of the memory device 100 that is depicted in FIG. 9. Therefore, the description of patterning and etching the gate structure depicted in FIG. 9 is suitable for describing the patterning and etching of the gate structure 10a depicted in FIG. 15. Following formation of the gate structure 10a, the interconnect wiring 28 is formed extending from the control gate layer 9 to the electrically conductive stud 29. The interconnect wiring 28 the memory device 100 that is depicted in FIG. 15 is similar to the interconnect wiring 28 of the memory device depicted in FIG. 9. Therefore, the description of patterning and etching the gate structure depicted in FIG. 9 is suitable for describing the patterning and etching of the gate structure 10a depicted in FIG. 15. The remaining elements of the logic device 200 and the memory device 100 have been described above with reference to FIGS. 1-14.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:
    forming a logic device on a semiconductor on insulating (SOI) layer of a transfer substrate, wherein the transfer substrate comprises a dielectric layer that is in contact with the SOI layer and a first handle substrate that is in contact with the dielectric layer;
    contacting a second handle substrate to the SOI layer of the transfer substrate that includes the logic device;
    removing the first handle substrate to expose the dielectric layer;
    forming a memory device on the dielectric layer; and
    forming interconnect wiring connecting the logic device with the memory device.

2. The method of claim 1, wherein the SOI layer has a thickness of less than 10 nm.

3. The method of claim 2, wherein forming the memory device comprises:
    forming a floating gate layer on the dielectric layer;
    forming a control dielectric layer on the floating gate layer; and
    forming a control gate layer on the control dielectric layer.

4. The method of claim 3, wherein the floating gate layer comprises nanoparticles, poly SiGe, nitride, a high-k dielectric or a combination thereof.

5. The method of claim 3 further comprising forming an electrically conductive stud extending through the dielectric layer into contact with a read and write wiring layer that is present between the SOI layer and the second handle substrate.

6. The method of claim 5, wherein said forming the interconnect wiring connecting the logic device with the memory device comprises forming a spacer on a sidewall of a gate stack comprising the floating gate layer, the control dielectric layer, and the control gate layer; and forming interconnect wiring connecting the control gate layer to the electrically conductive stud.

7. The method of claim 6, wherein said forming the interconnect wiring connecting the logic device with the memory device comprises:
    etching the control gate layer and a portion of the control dielectric layer, wherein a remaining portion of the control dielectric layer is present on the floating gate layer;
    forming an opening through the control dielectric layer to the electrically conductive stud; and
    depositing the interconnect wiring in the opening to the electrically conductive stud, wherein the interconnect wiring extends to the control gate layer.

8. The method of claim 1, wherein the logic device includes a gate structure on a channel portion of the SOI layer, and a source region and drain region on opposing sides of the channel portion of the SOI layer.

9. The method of claim 8, wherein the contacting of the second handle substrate to the SOI layer of the transfer substrate that includes the logic device comprises:
    forming a stressor layer on one of the second handle substrate and the SOI layer; and
    contacting the stressor layer to the one of the second handle substrate and the SOI layer that the stressor layer was not formed on.

10. The method of claim 9, wherein the removing of the first handle substrate to expose the dielectric layer comprises a controlled spalling process, wherein the first handle substrate may be cleaved to provide a remaining portion of the first handle substrate that is in contact with the dielectric layer and a removed portion of the first handle substrate that is separated from the remaining portion of the first handle substrate; and removing the remaining portion of the first handle substrate to expose the dielectric layer.

11. The method of claim 10, wherein said removing the remaining portion of the first handle substrate comprises a wet etching process, planarization or a combination thereof.

12. The method of claim 9, wherein the removing of the first handle substrate comprises polishing, grinding or a combination thereof.

13. A method of forming a semiconductor structure comprising:
forming a logic device on a semiconductor on insulating (SOI) layer of a transfer substrate, wherein the transfer substrate comprises a dielectric layer that is in contact with the SOI layer, a floating gate layer that is in contact with the dielectric layer, a a control dielectric layer that is in contact with the floating gate layer, and a first handle substrate that is in contact with the dielectric layer;
contacting a second handle substrate to the SOI layer of the transfer substrate that includes the logic device;
removing the first handle substrate to expose the dielectric layer;
forming a memory device on the dielectric layer; and
forming interconnect wiring connecting the logic device with the memory device.

14. The method of claim 13, wherein the SOI layer has a thickness of less than 10 nm.

15. The method of claim 14, wherein the logic device includes a gate structure on a channel portion of the SOI layer, and a source region and a drain region on opposing sides of the channel portion of the SOI layer.

16. The method of claim 13, wherein the removing of the first handle substrate to expose the dielectric layer comprises a controlled spalling process, wherein the first handle substrate may be cleaved to provide a remaining portion of the first handle substrate that is in contact with the dielectric layer and a removed portion of the first handle substrate that is separated from the remaining portion of the first handle substrate; and removing the remaining portion of the first handle substrate to expose the dielectric layer.

17. The method of claim 13, wherein said removing the remaining portion of the first handle substrate comprises a wet etching process, planarization or a combination thereof.

18. The method of claim 13, wherein forming the memory device comprises:
forming a control gate layer on the control dielectric layer.

19. The method of claim 18 further comprising forming an electrically conductive stud extending through the dielectric layer into contact with a read and write wiring layer that is present between the SOI layer and the second handling substrate.

20. The method of claim 19, wherein said forming the interconnect wiring connecting the logic device with the memory device comprises forming a spacer on a sidewall of a gate stack comprising the floating gate layer, the control dielectric layer, and the control gate layer; and forming interconnect wiring connecting the control gate layer to the electrically conductive stud.

21. The method of claim 20, wherein said forming the interconnect wiring connecting the logic device with the memory device comprises:
etching the control gate layer and a portion of the control dielectric layer, wherein a remaining portion of the control dielectric layer is present on the floating gate layer;
forming an opening through the control dielectric layer to the electrically conductive stud; and
depositing the interconnect wiring in the opening to the electrically conductive stud, wherein the interconnect wiring extends to the control gate layer.

* * * * *